(12) United States Patent
Gao (10) Patent No.: US 11,792,959 B2
(45) Date of Patent: Oct. 17, 2023

(54) BIDIRECTIONAL CONNECTOR FOR SERVER LIQUID COOLING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 28 days.

(21) Appl. No.: 17/483,029

(22) Filed: Sep. 23, 2021

(65) Prior Publication Data

US 2023/0086534 A1    Mar. 23, 2023

(51) Int. Cl.
*H05K 7/20* (2006.01)

(52) U.S. Cl.
CPC ......... *H05K 7/20509* (2013.01); *H05K 7/208* (2013.01); *H05K 7/20327* (2013.01); *H05K 7/20663* (2013.01)

(58) Field of Classification Search
CPC ........... H05K 7/20509; H05K 7/20327; H05K 7/20663; H05K 7/208; F16L 33/00; F16L 39/005
See application file for complete search history.

(56) References Cited

U.S. PATENT DOCUMENTS

| | | | | |
|---|---|---|---|---|
| 5,574,627 | A | * | 11/1996 | Porter ................... H01L 23/473 257/E23.098 |
| 9,328,854 | B2 | * | 5/2016 | Seryi ................... B60H 1/00571 |
| 2007/0241560 | A1 | * | 10/2007 | Malone ................ F16L 37/565 285/123.3 |

\* cited by examiner

*Primary Examiner* — Lionel Nouketcha
(74) *Attorney, Agent, or Firm* — WOMBLE BOND DICKINSON (US) LLP (57) ABSTRACT

According to one embodiment, a cooling assembly includes a cooling plate to be attached to an electronic device and a bidirectional connector for circulating cooling fluid to the cooling plate. The bidirectional connector includes a first tubing structure having a first fluid channel therein to supply the cooling fluid flowing in a first direction to the cooling plate, a second tubing structure that encloses the first tubing structure therein. The first tubing structure is positioned spaced apart from the second tubing structure to form a second fluid channel between an outer surface of the first tubing structure and an inner surface of the second tubing structure. The second fluid channel is configured to receive the cooling fluid returned from the cooling plate. The first and second fluid channels are configured to operate a supply and a return fluid streams in opposite directions, respectively.

19 Claims, 6 Drawing Sheets

BIDIRECTIONAL CONNECTOR FOR SERVER LIQUID COOLING

FIELD

Embodiments of the present disclosure relate generally to a connector for electronics liquid cooling in data centers such as servers with one or more high performance processors and chips.

BACKGROUND

Information Technology (IT) includes technology such as computers that are accessible through the internet or a local network, which provide storage of, or access to, data, websites, computer programs, algorithms, services, and more. IT equipment such as servers and other electronic devices (e.g., peripheral devices) can be installed in a chassis. These chassis can then be installed in an IT rack. An IT rack can be populated with a plurality of chassis, each housing IT equipment, as a manner of managing power and thermal requirements of the IT equipment.

Thermal management for a data center that includes several active electronic racks is critical to ensure proper performance of servers and other IT equipment (e.g., performing IT services) that is operating in the racks. Without proper thermal management, however, the thermal environment (e.g., temperature) within the racks may exceed thermal operational thresholds, which may result in adverse consequences (e.g., processor slowing down, servers failing, etc.). One way to manage the thermal environment is the use of cooling air to cool the IT equipment. The cooling air is recirculated through cooling units. Heat generated by the IT equipment is captured by the cooling air and is extracted by the cooling unit. There are many existing air cooling solutions for data centers with a primary function to supply cooling air to a room, remove hot air from the room, and process the hot air back to the cooling air.

Modern data centers have been deploying more high-power density electronic racks, in which more high-density chips are packaged closer together to provide more processing power. Cooling these high-density racks by maintaining a proper thermal environment may be an issue with existing cooling systems, such as air cooling system using a computer room air conditioning (CRAC) unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks, which may cause significantly amount of energy consumption.

A liquid cooling system transfers and delivers liquid between an IT rack and the chassis, and between the chassis and the IT equipment that is mounted on the chassis. Such a system can provide high operational and cooling efficiency of the IT equipment. Liquid cooling for high power density electronics has increased in popularity because air cooling can be thermally insufficient in some circumstances. Liquid cooling allows for higher packaging density and increased computing load of electronics, by transferring greater thermal energy from the electronic equipment. The present solution focuses on a constant design optimization to accommodate the increasing power densities of the servers and processors.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

As servers become denser, the available space in a cooling system becomes limited. The existing connector for a liquid cooling system design lacks a consideration for limited space. In addition, the existing connector only enables a single fluid flowing direction.

The present disclosure solves the problems described above by providing a connector assembly for the liquid cooling system. Specifically, the present disclosure describes the connector assembly includes two tubing structures of which a second tubing structure encloses a first tubing structure. The connector assembly enables the flow of two fluids in opposite directions, which may significantly benefit the server and electronics cooling. Both tubing structures create two fluid channels having fluid flowing in two directions. The entire connection module is a dripless design. A first side of the connector assembly is to be coupled to another part of the connector side and a second side of the connector assembly is designed for connecting with either hoses or a fluid line converter. The fluid line converter includes two separate ports for connecting with two separate single stream ports and one combined ports for connecting with the connector in an embodiment. The first fluid channel is configured to supply the cooling fluid flowing in a first direction to a cooling plate (also referred to as a cold plate) and the second fluid channel is configured to receive the cooling fluid returned from the cooling plate. It is to be noted that the supply and the return of the cooling fluid can be reversed in an embodiment.

According to one embodiment, a cooling assembly includes a cooling plate to be attached to an electronic device and a bidirectional connector for circulating cooling fluid to the cooling plate. The bidirectional connector includes a first tubing structure having a first fluid channel therein to supply the cooling fluid flowing in a first direction to the cooling plate. The bidirectional connector also includes a second tubing structure that encloses the first tubing structure therein. The first tubing structure is positioned spaced apart from the second tubing structure to form a second fluid channel between an outer surface of the first tubing structure and an inner surface of the second tubing structure. The second fluid channel is configured to receive the cooling fluid returned from the cooling plate. The bidirectional connector further includes a support structure positioned between the first tubing structure and the second tubing structure adapted to maintain the space between the first and second tubing structures and to allow the cooling fluid to flow in the second direction without substantially impeding the cooling fluid.

In one embodiment, a cooling assembly additionally includes a fluid line converter coupled to the bidirectional connector. The fluid line converter includes a first breakout port in fluid communication with the first fluid channel. The breakout port extending from the first fluid channel. The first breakout port is to be coupled to a supply manifold coupled to an external fluid source to receive the cooling fluid. The fluid line converter additionally includes a second breakout port in fluid communication with the second fluid channel, wherein the second breakout port is to be coupled to a return manifold and configured to return the cooling fluid back to the external fluid source via the return manifold.

In one embodiment, a first end of the bidirectional connector is adapted to be coupled to a first interface with dripless mechanism. The coupled first end of the bidirectional connector fluidly connects the bidirectional connector to the first dripless interface. A second end of the bidirectional connector is adapted to be coupled to a second interface. The coupled second end of the bidirectional connector fluidly connects the bidirectional connector to the second interface.

In one embodiment, the first end of the bidirectional connector is positioned to couple the bidirectional connector to another bidirectional connector. The first end of the bidirectional connector includes a head positioned to block the first fluid channel and the second fluid channel while the bidirectional connector is not coupled to another bidirectional connector with the first end of the bidirectional connector, and to open the first fluid channel and the second fluid channel while the bidirectional connector is coupled to another bidirectional connector with the first end of the bidirectional connector.

In one embodiment, the second end of the bidirectional connector comprises a barb positioned to couple the first fluid channel and the second fluid channel to separate hoses. In one embodiment, a female side of the bidirectional connector is connected to a male side of a second bidirectional connector of the cooling plate for cooling the computing component. The other side of the second bidirectional connector is connected to the fluid line converter via flexible hoses.

According to another embodiment, the above cooling assemblies can be implemented in a server chassis. In one embodiment, two or more bidirectional connectors connect corresponding cooling plates of the cooling assemblies to corresponding fluid line converters of the cooling assemblies. The first fluid channel of each of the two or more bidirectional connectors is connected to a single main fluid supply line and the second fluid channel of each of the two or more bidirectional connectors is connected to a single return fluid supply line to place the cooling plates in fluid communication with a cooling fluid source.

In one embodiment, each of the cooling plates includes a container comprising a top portion and a bottom portion. The top portion and the bottom portion is naturally formed when the cooling fluid is circulated. The liquid phase of the cooling fluid is supplied via the first fluid channel while the cooling fluid is circulated. The top portion above the liquid surface defines a vapor region positioned to receive fluid vapor changed from the liquid phase of the cooling fluid. The vapor exits the vapor region via the second fluid channel.

In one embodiment, pairs of the cooling plates are arranged in parallel fluid communication with a corresponding fluid line converter of the fluid line converters, and pairs of the fluid line converters are stacked on top of each other. Each of the cooling plates are arranged in serial fluid communication with a corresponding fluid line converter, and the fluid line converters are in parallel fluid communication with the cooling fluid source. The bidirectional connectors are substantially directly fluidly connected to corresponding fluid line converters.

According to another embodiment, an electronic rack includes a rack manifold and server chassis. Each server chassis includes the above described cooling assemblies.

A system, as discussed above, in accordance with embodiments may provide a fluid connector with multiple chambers running bidirectional fluid streams that provides a complete system and module design for liquid cooling to increase reliability; a flexible hardware solution for eliminating fluid leakage impact; support for hyperscale deployment, as well as edge use cases. The design aims to solve the challenge for liquid cooling design for high density servers which space is limited and reliability is critical.

The system can accommodate requirement from cloud computing and edge computing servers; different server architectures and configurations; different cooling fluids; and different server cooling module requirements. Consequently, the system in accordance with embodiments disclosed herein may provide ease of installation and operation. The embodiments described herein may provide flexible solutions which can be used to adjust different time difference between supply and return; and be of high flexibility with respect to the types of devices, size of devices, and configurations of devices that will be thermally managed by the system and/or may provide other benefits.

Figures 1A, 1B:
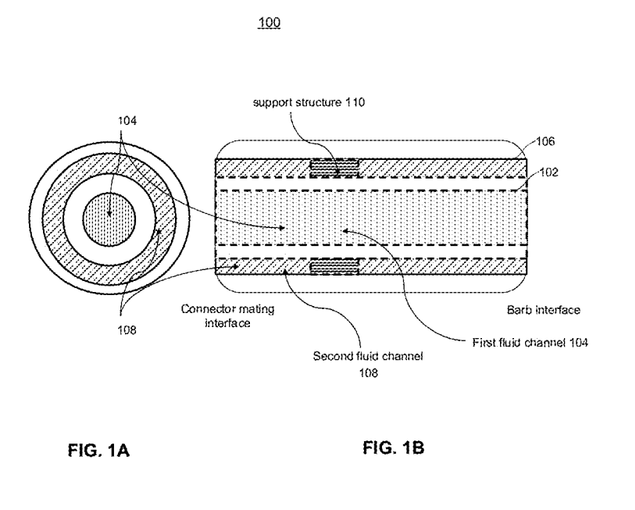
FIG. 1A is a schematic illustrating a cross sectional view of an example of a bidirectional connector according to one embodiment.
FIG. 1B is a schematic illustrating a sectional view of an example of a bidirectional connector according to one embodiment.

FIG. 1A is a schematic diagram illustrating a cross sectional view of an example of a bidirectional connector 100 according to one embodiment. FIG. 1B is a schematic illustrating a sectional view of an example of a bidirectional connector 100 according to one embodiment. The bidirectional connector 100 is a part of a cooling assembly for providing liquid cooling to a computing component positioned on a circuit board such as a printed circuit board (PCB). The cooling assembly may also include a cooling plate to be attached to an electronic device, where the bidirectional connector is to be connected with a corresponding connector of the cooling plate.

Referring to FIGS. 1A and 1B, in an embodiment, the bidirectional connector 100 includes a first tubing structure 102 having a first fluid channel 104 therein to supply the cooling fluid flowing in a first direction to the cooling plate. The bidirectional connector 100 also includes a second tubing structure 106 that encloses the first tubing structure 102 therein. The first tubing structure 102 is positioned spaced apart from the second tubing structure 106 to form a second fluid channel 108 between an outer or exterior surface of the first tubing structure 102 and an inner or interior surface of the second tubing structure 106. The second fluid channel 108 is configured to receive the cooling fluid returned from the cooling plate.

The first and second tubing structures may have a circular cross section and being substantially hollow. The first and second tubing structures may be divided by a divider having a first annular cross section and being substantially solid. The divider extends a first thickness from an outer surface along a length of the first fluid channel. The bidirectional connector may include an outer sheath having a third annular cross section and being substantially solid. The outer sheath extending a third thickness from an outer surface of the second fluid channel.

As illustrated in FIG. 1, the bidirectional connector 100 further includes a support structure 110 positioned between the first tubing structure 102 and the second tubing structure 106 adapted to maintain the space between the first 102 and second 106 tubing structures and to allow the cooling fluid to flow in the second direction without substantially impeding the cooling fluid. The support structure 110 enables the first tubing structure 102 and second tubing structure 106 to be fixed together and at the same time, it enables the cooling fluid stream flowing through the second fluid channel 108.

In an embodiment, the bidirectional connector includes a first end and a second end. The first end includes a dripless blind mate interface to be connected with another dripless blind mate connector such as a connector disposed on a cooling plate. The second end includes a barb structure or interface that can be connected with a flexible hose, where the flexible hose may be connected with an external fluid connection such as a server chassis main fluid line or a rack manifold.

Figure 2A:
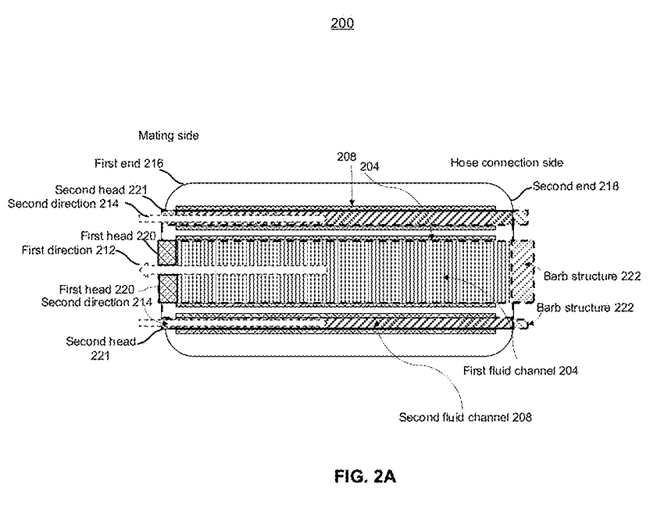
FIG. 2A is a schematic illustrating a sectional view of an example of a bidirectional connector according to one embodiment.

FIG. 2A is a schematic diagram illustrating a sectional view of an example of a bidirectional connector 200 according to one embodiment. As illustrated in FIG. 2A, the first fluid channel 204 is configured to supply the cooling fluid flowing in a first direction 212 to a cooling plate. As shown, the second fluid channel 208 is configured to receive the cooling fluid flowing in a second direction 214 returning from the cooling plate. As shown, the first direction 212 and the second direction 214 are in opposite directions.

In one embodiment, a first end 216 of the bidirectional connector 200 is adapted to be coupled to a first dripless interface (not shown). The coupled first end 216 of the bidirectional connector 200 fluidly connects the bidirectional connector 200 to the first dripless interface. A second end 218 of the bidirectional connector 200 is adapted to be coupled to a second interface (not shown). The coupled second end 218 of the bidirectional connector 200 fluidly connecting the bidirectional connector 200 to the second interface.

In one embodiment, the first end 216 of the bidirectional connector 200 is positioned to couple the bidirectional connector 200 to another bidirectional connector (e.g., a connector of a cooling plate). The first end 216 of the bidirectional connector 200 includes a first head 220 positioned to block the first fluid channel 204 and the second fluid channel 208 while the bidirectional connector 200 is not coupled to another bidirectional connector with the first end 216 of the bidirectional connector 200. The head first 220 is also positioned to open the first fluid channel 204 and the second fluid channel 208 while the bidirectional connector 200 is coupled to another bidirectional connector with the first end 216 of the bidirectional connector.

The internal structure of the first head 220 and the second head 221 may be a frame connecting between the first head 220 and the second head 221 and an internal ball of the first fluid and second fluid channels. The internal structure of the first head 220 and the second head 221 may include elastic components such as a spring acting as a connector engagement to enable the bidirectional connector 200 to engage with the channels (e.g., first and second fluid channels) of another bidirectional connector. The elastic components may block the first fluid channel 204 and the second fluid channel 208 when the connector engagement is released.

Figure 2B:
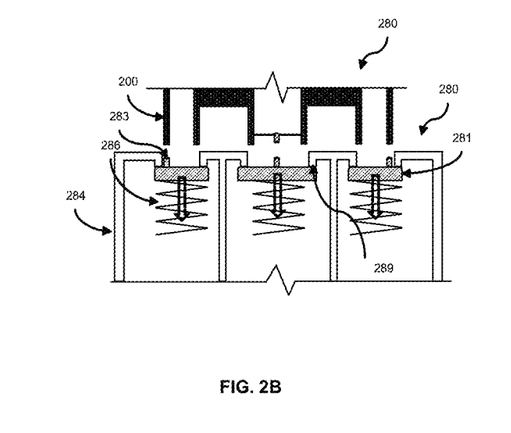
FIG. 2B schematic illustrating an example of an internal structure of a first head according to one embodiment.

FIG. 2B illustrates further features of this embodiment. One feature is the internal structure of first head 220 including a drip flap 280 which closes off the fluid passage when it is disconnected. The act of inserting the coupler automatically displaces the drip flap 280 to enable fluid to flow; however, when the coupler is removed, the drip flap 280 snaps back to block the passage and avoid drips. FIG. 2B is a truncated drawing of the top section of the coaxial port 284 and bottom part of a bidirectional connector 200 (the other side of the bidirectional connector 200 would be connected to, e.g., a hose or a pipe). The drip flap 280 is formed of a seal plate 281 (which would be disk shaped for the center conduit and ring shaped for the ring conduit) attached to a resilience element, such as a spring 286.

The top surface of the seal plate includes engagement element, such as one or more dimples 283. In its non-engaged position of the drip flap 290, the resilience element urges the seal plates against a seal surface 289 of the coaxial port. However, when the bidirectional connector 200 is inserted into the coaxial port it pushed against the dimples so as to compress the resilience elements 286, as illustrated by the dotted arrows, thus pushing the seal plates away from the seal surface 289 and enabling fluid flow from the bidirectional connector 200 to the coaxial port 284. When the bidirectional connector 200 is removed, the resilience elements 286 would again urge the sealing plates against the sealing surface 289 and prevent any drips. Resilient elements 286 maybe fixed onto the internal wall of the bidirectional connector 200, which is not shown.

One end (e.g., first end 216) of the bidirectional connector 200 may be configured for mating with another pair of the bidirectional connector. The fluid channels (e.g., the first fluid channel 204 and the second fluid channel 208) are blocked by the head 220 at this end 216. This end 216 is pushed towards the other side of another bidirectional connector 200 during mating with other side of the bidirectional connector 200. Once the head 220 is pushed to the connecting position, the fluid channels (e.g., the first fluid channel 204 and the second fluid channel 208) are open and connect to the fluid channels of another bidirectional connector 200. It will be appreciated that the end 216 maybe designed in a different type of head structure to provide dripless feature. The other end (e.g., 218) of the bidirectional connector 200 is configured as a barb structure 222 this means two channels are able to connect with separate hoses in an embodiment.

Figure 3:
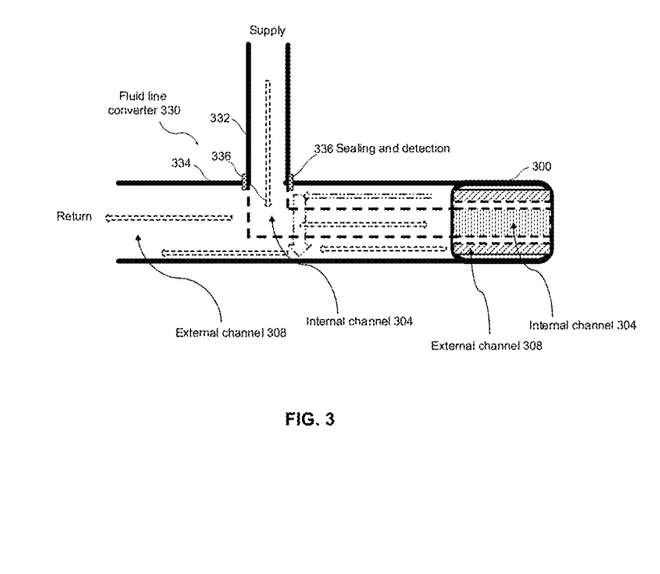
FIG. 3 is a schematic illustrating a sectional view of an example of a bidirectional connector coupled to an example of a fluid line converter according to one embodiment.

FIG. 3 is a schematic diagram illustrating a sectional view of a cooling assembly including a bidirectional connector 300 coupled to an example of a fluid line converter 330 according to one embodiment. A cooling assembly further includes a fluid line converter 330 coupled to the bidirectional connector 300. The fluid line converter 330 includes a first breakout port 332 in fluid communication with the first fluid channel 304. The first breakout port 332 extends from the first fluid channel 304. The first breakout port 332 is to be coupled to a supply manifold coupled to an external fluid source to receive the cooling fluid. The fluid line converter 330 further includes a second breakout port 334 in fluid communication with the second fluid channel 308. The second breakout port 334 is to be coupled to a return manifold and configured to return the cooling fluid back to the external fluid source via the return manifold.

The fluid line converter 330 connects the bidirectional connector 300 to a supply fluid loop (e.g., supply manifold) and a return fluid loop (e.g., return manifold) used in a cooling fluid loop. The bidirectional connector 300 also include a mating section which enables a dripless feature. The fluid line converter 330 includes ports or interfaces (e.g., a first breakout port 332 and a second breakout port 334) for connecting the bidirectional connector 300 to supply and return loops.

For example, the first breakout port 332 is to be coupled to a supply manifold coupled to an external fluid source to receive the cooling fluid. It should be appreciated that illustrated embodiments described herein can support different types of connections, including barb hoses or quick disconnect hoses. The two fluid channels (e.g., the first fluid channel 304 and the second fluid channel 308) that connect to the first breakout port 332 and the second breakout port 334 are merged and packaged together. It can be seen that the first fluid channel 304 is positioned internal to the second fluid channel 308.

It should be appreciated that the location where the two channels are physically merged may be sealed. In one embodiment, a leak detection mechanism (e.g., a leak detector 336) can be implemented at this location. For example, a leak detector 336 (sensor or apparatus) may be coupled to this location and configured to sense cooling fluid leakage into the location where the two channels are physically merged. The internal channel (e.g., the first channel 304) is configured for a fluid supply stream and the external channel (e.g., the second channel 308) is configured for a fluid return stream. The interface that connects the bidirectional connector 300 and the fluid line converter 330 may be pre-fabricated or connected through a section of flexible hoses. In an embodiment, the internal channel 304 is configured for a return fluid and the external channel 308 is configured for a supply fluid.

Figure 4:
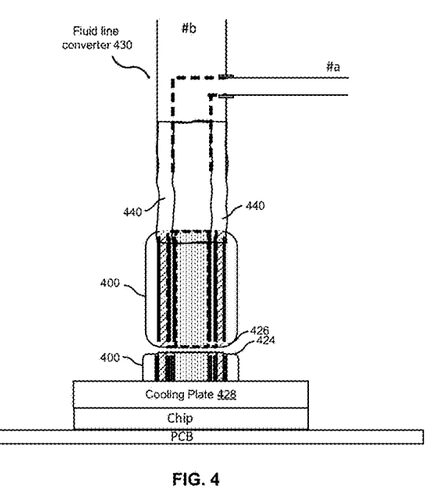
FIG. 4 is a schematic illustrating a sectional view of an example of a fluid line converter coupled to an example of a bidirectional connector for circulating cooling fluid to a cooling plate attached to an electronic device according to one embodiment.

FIG. 4 is a schematic diagram illustrating a sectional view of an example of a fluid line converter 430 coupled to an example of a bidirectional connector 400 for circulating cooling fluid to a cooling plate 428 attached to an electronic device according to one embodiment. In one embodiment, similar to the bidirectional connector as shown in FIGS. 1 and 2, the fluid line converter 430 includes an inner tube and an outer tube that encloses the inner tube. A first end of the inner tube is connected to the first breakout port, in this example, port #a. A first end of the outer tube is connected to the second breakout port, in this example, port #b. A second end of the inner tube and a second end of the outer tube form a coaxial port that can be connected to the bidirectional connector 400, such that the first fluid channel (e.g., fluid supply channel) is connected to the first breakout port and the second fluid channel (e.g., fluid return channel is connected to the second breakout port. The fluid line converter basically acts as a fluid channel splitter from a coaxial dual channel configuration to a single channel configuration.

Referring to FIG. 4, a female side 424 of the bidirectional connector 400 is connected to a male side 426 of a second bidirectional connector 400 of the cooling plate for cooling the computing component. The other side 426 of the second bidirectional connector 400 is connected to the fluid line converter 430 via flexible hoses 440. In one embodiment, the male side 426 of a second bidirectional connector 400 includes barbs for connecting with fluid line or fluid converters. In the embodiment of FIG. 4, the port identified as #a represents a first breakout port 332 in FIG. 3. Similarly, the port identified as #b represents a second breakout port 334 in FIG. 3. It needs to be mentioned that connectors 424 and 426 can be understood as a male type and a female type, respectively. In addition, it needs to be appreciated that the head of the connector can be designed in different structures to provide the dripless feature. This head of the connector with dripless quick disconnect feature uses the existing design and packaging technologies. This means the key feature is that each side of the connector 400 includes two heads.

Figure 5:
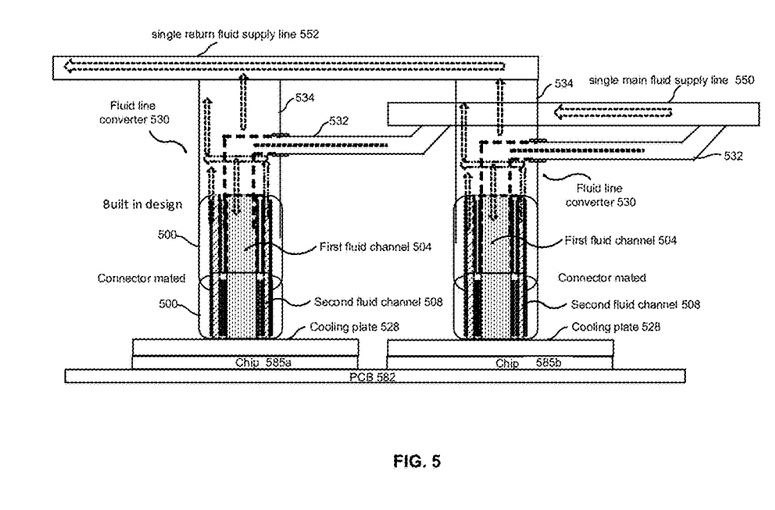
FIG. 5 is a schematic illustrating a sectional view of an example of fluid line converters coupled to an example of a bidirectional connector for circulating cooling fluid to cooling plates attached to an electronic device according to one embodiment.

FIG. 5 is a schematic diagram illustrating a sectional view of an example of fluid line converters coupled to an example of bidirectional connectors for circulating cooling fluid to cooling plates attached to an electronic device according to one embodiment.

Referring to FIG. 5, two or more bidirectional connectors 500 connect corresponding cooling plates 528 of the cooling assemblies to corresponding fluid line converters 530 of the cooling assemblies. As illustrated, two chips 585*a* and 585*b* are mounted onto the electronics board (e.g., printed circuit board (PCB)) 582. The first fluid channel 504 of each of the two or more bidirectional connectors 500 is connected to a single main fluid supply line 550 and the second fluid channel of each of the two or more bidirectional connectors is connected to a single main fluid return line 552 to place the cooling plates 528 in fluid communication with a cooling fluid source. Each of the first breakout port 532 of the fluid line converters 530 are connected to the single main fluid supply line 550.

In this manner, the cooling fluid can be delivered to each of the cooling plates 528 from the cooling fluid source via each of the cooling assemblies. Similarly, each of the second breakout port 534 of the fluid line converters 530 are connected to the single main fluid return line 552. In this manner, the cooling fluid can be returned from each of the cooling plates 528 to the cooling fluid source via each of the cooling assemblies. As shown, the single main fluid supply line 550 and the single main fluid return line 552 are connected to a single loop. The connecting details between the fluid line converters 530 and the single loop are not shown in FIG. 6.

Figure 6:
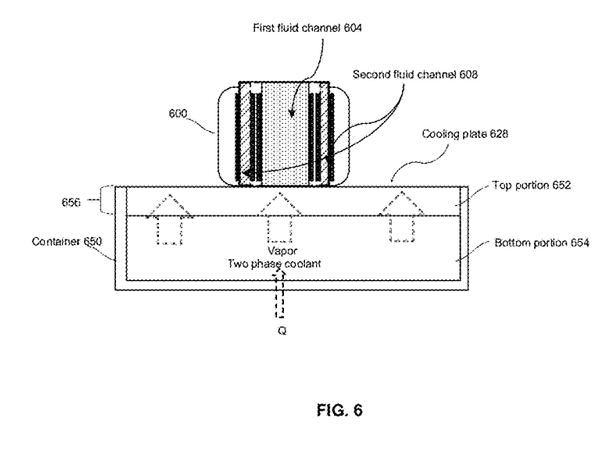
FIG. 6 is a schematic illustrating a sectional view of an example of simplified representation of a bidirectional connector coupled to an example of a cooling plate including a container according to one embodiment.

FIG. 6 is a schematic diagram illustrating a sectional view of an example of a bidirectional connector 600 coupled to an example of a cooling plate 628 including a container 650 according to one embodiment. In one embodiment, cooling plate 628 is a two phase cooling plate. Referring to FIG. 6, each of the cooling plates 628 includes a container 650 including a top portion 652 and a bottom portion 654. In one embodiment, the top portion 652 and the bottom portion 654 are formed once the flowing fluid is filled within the container 650. In some embodiments, the container 650 may be fully filled with the cooling liquid. The fluid level may depend on the operation and the fluid level may vary. In one embodiment, the container 650 can be also understood as the cooling fluid region. Cooling fins (not shown) maybe designed within the cooling fluid region 650. The bottom portion 654 is positioned to receive a liquid phase of the cooling fluid. The liquid phase of the cooling fluid is supplied via the first fluid channel 604 while the cooling fluid is circulated. The top portion 652 defining a vapor region 656 positioned to receive cooling fluid vapor formed from the liquid phase of the cooling fluid. The cooling fluid vapor exits the vapor region 656 via the second fluid channel 608.

In one operation, for example, the internal fluid channel (e.g., first fluid channel 604) is configured for cooling liquid inlet and the external fluid channel (e.g., fluid channel 608) is configured for vapor exit. The cooling fluid may be a phase change liquid. The cooling plate 628 includes a chamber (e.g., container 650) for containing the phase change fluid in liquid phase. The top portion 652 of the container is configured for vapor region 656. The internal fluid channel allows the liquid phase to directly delivered to the cooling plate 628. The vapor exits the cooling plate 628 via the external fluid channel. It can be appreciated that the diameter of the internal and external fluid channels may be adjusted for an optimized design. The embodiments described in FIG. 6 extends the vapor region opening area with an optimized opening area for the cooling liquid. In addition, the cooling plate in the described embodiment occupies less space. Failure ports on a cooling plate design may be minimized. The embodiments described in FIG. 6 can also identify the supply and return lines on the cooling plate for ease of implementation, as well as enables the cooling plate for two phase cooling.

Figure 7A:
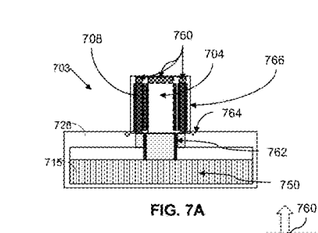
FIGS. 7A-7B illustrate an embodiment of a cooling plate having coaxial port feature according to one embodiment.
Figure 7B:
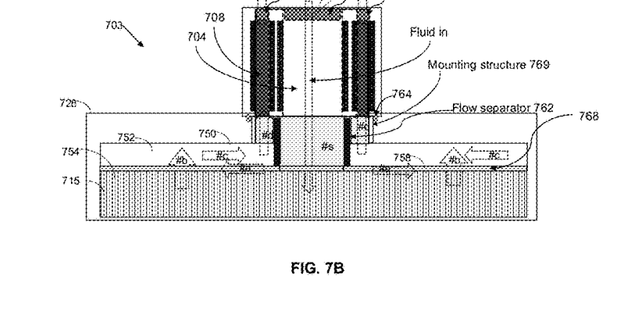

FIGS. 7A-7B illustrate an embodiment of a cooling plate having a single coaxial fluid port, according to an embodiment. One feature is the no-drip flap 760 which closes off the fluid passage when it is disconnected. The act of inserting the coupler automatically displaces the flap 760 to enable fluid to flow; however, when the coupler is removed, the flap springs back to block the passage and avoid drips. In this embodiment, the cooling plate 728 includes cavity 750 which incorporates cooling fins 715 functioning as flow restrictors to redirect the flow as needed. The cooling fins 715 are arranged to direct the circulating cooling fluid from the inlet, through the cavity 750, and out the outlet. Different fin designs can be employed to achieve this circulation, and some examples will be provided below. Alternatively, other flow restriction elements can be used to direct the flow of the fluid inside the cavity 750.

In this particular example, the cavity 750 is divided into lower chamber 754 and upper chamber 752 by a distribution plate 768. The distribution plate 768 includes two triangular areas having the surfaces that contact the top of the fins when installed, and the two funnel shaped distribution channel cores 768 of the distribution panel 768.

The fluid supplied from the port 766 enters one of the chambers (here bottom chamber 754), then flows to the other chamber (here upper chamber 752), and from there exits through the port 766, as illustrated by the arrows in FIG. 7B. Note that since the bottom chamber 754 is in contact with the bottom surface of the plate (which is the surface that contacts the chip) the cooling liquid should first flow to the bottom chamber to efficiently remove heat from the chip.

As illustrated in FIGS. 7A-7B, the cooling plate 703 incorporates a single port, which serves both as a supply port and a return port. As illustrated by the callout in FIG. 7B, the supply port and return port are arranged coaxially, such that a first fluid channel 704 (e.g., central fluid passage) is located centrally within a second fluid channel 708 (e.g., second ring-shaped fluid passage). Depending on how the supply and return lines are connected, each passage may be used for supply or return. In the example of FIG. 7B the central passage is utilized as the supply port, while the exterior ring passage is used as the return port, as noted by the dashed-arrows indicating fluid flow. The dash-dot oval ring in the callout indicates that the conduits need not necessarily be circular. For example, in cases where it is desired to maintain polarity orientation of the connectors, the conduit may be oval, forcing the connector to be inserted in only one of two orientations.

In FIG. 7B, arrows in dash line represents the fluid streams. Incidentally, in the drawings, the arrows identified by #s represent the fluid supply, the arrows identified by #a represent the fluid spreading among the fins below the distribution plate 768 and may also indicate the spreading pattern within the distribution plate (in FIG. 7B #a is flowing in and out of the page), the arrows identified by #b represent the upward vertical streams moving from bottom chamber 754 to upper chamber 752, via return channels the arrows identified by #c represent the return flow above the distribution plate 768, the arrows identified by #d represent the return flow in the ring conduit. In the embodiment of FIGS. 7A-7B, the fluid streams identified as #b happen only at the edges of the fins, where the distribution plate 768 does not cover the fins. The fluid spreads within the distribution panel and then flows into the return channels, as indicated by arrows #b seen only formed at the edge of the fins 715. The edge of the fins 715 is not covered by the distribution plate 768.

In this embodiment, the plate 703 itself is also modified to include a flow separator 762. The flow separator ensures that liquid entering from the coaxial port is directed properly to flow within the cavity 750 and not mix with the returning fluid. In this particular example, the flow separator 762 ensures that liquid delivered via the center conduit 704 flows into the bottom chamber 754 and cannot flow directly to the upper chamber 752, but rather flow through the distribution plate 768 first and then to the upper chamber 752. The flow separator 762 may be an integral part of the cooling plate 728, it may be a separate part inserted into the opening in the cooling plate 728 or onto the coaxial port connector, or it may be an integral part of the coaxial port connector. Regardless of the form of the flow separator 762, the design needs to ensure a good seal between the center conduit 704 and the top of the flow separator 762. In this example, a mounting structure 769 is provided within cooling plate 728 to accept and secure the coaxial port connector 766.

The embodiment of FIGS. 7A and 7B also includes a leak detection arrangement 764. The leak detection arrangement 764 integrates a leak detector at the connection surface between the cooling plate 728 and the coaxial port 766. This is the place most susceptible to developing leaks, so placing the leak detector in this position would be most advantageous. In one embodiment the leak detection is integrated inside of the cooling plate 728 and being sandwiched between the cooling plate 728 top surface and bottom surface of the coaxial connector 766. This ensures that the leak detection sensor identify the leaking of the fluid before the fluid leaks out from the connection interface.

Figure 8:
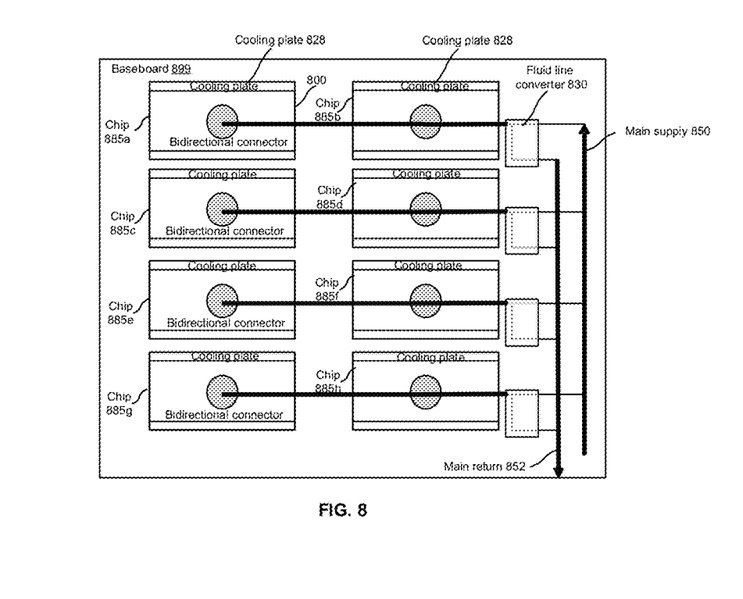
FIG. 8 is a schematic illustrating an example of fluid line converters coupled to a bidirectional connector for circulating cooling fluid to multiple cooling plates attached to an electronic device according to one embodiment.

FIG. 8 is a schematic diagram illustrating an example of fluid line converters coupled to a bidirectional connector for circulating cooling fluid to multiple cooling plates attached to an electronic device according to one embodiment. Referring to FIG. 8, in one embodiment, pairs of the cooling plates 828 are all arranged in parallel fluid communication with a corresponding fluid line converter 830 of the fluid line converters. Pairs of the fluid line converters 830 are stacked on top of each other. The pairs of the fluid line converters 830 are connected to a main fluid supply line 850.

In this example, eight cooling plates 828 are arranged in parallel on a high density electronics board PCB 899. These eight cooling plates 828 are mounted on eight chips (885a-885h) positioned on the electronics board PCB 899. Each of the cooling plates 828 may be connected to the bidirectional connector 800. Although there are four fluid line converters 830 are shown in FIG. 8, each fluid line converter 830 is connected to a corresponding cooling plate 828. Each shown fluid line converter 830 represents two fluid line converters 830. In one embodiment, the two fluid line converters 830 are stacked on top of each other.

Figure 9:
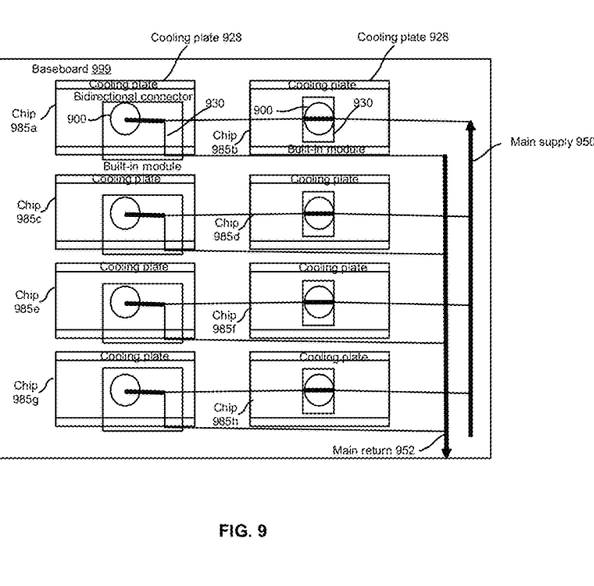
FIG. 9 is a schematic illustrating another example of fluid line converters coupled to a bidirectional connector for circulating cooling fluid to multiple cooling plates attached to an electronic device according to one embodiment.

FIG. 9 is a schematic diagram illustrating another example of fluid line converters coupled to a bidirectional connector for circulating cooling fluid to multiple cooling plates attached to an electronic device according to one embodiment. Eight cooling plates 928 are mounted on eight chips (985a-985h) positioned on the electronics board PCB 999. In one embodiment, as illustrated in FIG. 9, each of the cooling plates 928 is arranged in serial fluid communication with a corresponding fluid line converter. The fluid line converters are in parallel fluid communication with the cooling fluid source. The bidirectional connectors are substantially directly fluidly connected to corresponding fluid line converters.

Each of the two cooling plates 928 is arranged in parallel manner. As shown in FIG. 9, the bidirectional connector 900 is integrated with the fluid line converter 930 and is positioned closer to the cooling plate 928. In this manner, the use of flexible hoses or other fluid piping can be eliminated.

Figure 10:
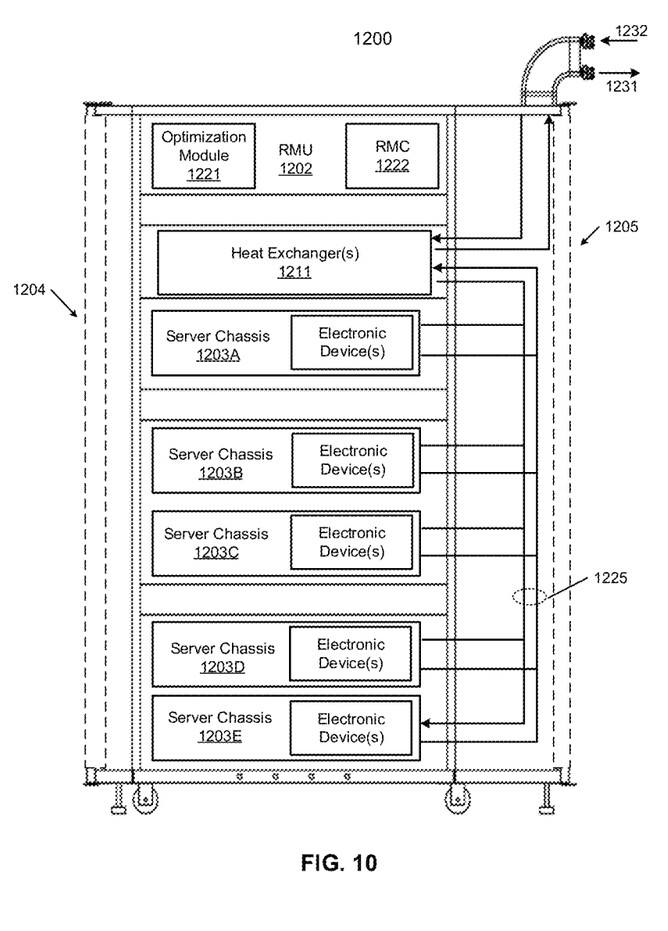
FIG. 10 is a schematic illustrating an example of an electronic rack according to one embodiment.

FIG. 10 is block diagram illustrating an electronic rack according to one embodiment. Electronic rack 1200 may represent any of the electronic racks as described throughout this application. According to one embodiment, electronic rack 1200 includes, but is not limited to, heat exchanger 1211, rack management unit (RMU) 1202, and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Note that although there are five server chassis 1203A-1203E shown here, more or fewer server chassis may be maintained within electronic rack 1200. Also note that the particular positions of heat exchanger 1211, RMU 1202, and/or server chassis 1203 are shown for the purpose of illustration only; other arrangements or configurations of heat exchanger 1211, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the backends of server chassis 1203 or on the electronic rack to generate airflows flowing from frontend 1204, traveling through the air space of the sever chassis 1203, and exiting at backend 1205 of electronic rack 1200.

In one embodiment, heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchanger 1211 further includes a second loop with two ports having a second pair of liquid connectors coupled to rack manifold 1225 to form a secondary loop, which may include a supply manifold (also referred to as a rack liquid supply line or rack supply manifold) to supply cooling liquid to server chassis 1203 and a return manifold (also referred to as a rack liquid return line or rack return manifold) to return warmer liquid back to heat exchanger 1211. Note that heat exchanger 1211 can be any kind of heat exchangers commercially available or customized ones. Thus, the details of heat exchanger 1211 will not be described herein.

Each of server chassis 1203 may include one or more information technology (IT) components (e.g., electronic devices such as processors, memory, and/or storage devices). In one embodiment, in at least some of the server chassis 1203, an electronic device may be attached to a cooling plate. The cooling plate includes a liquid distribution channel to receive cooling liquid from the rack liquid supply line of rack manifold 1225. The cooling liquid performs heat exchange from the heat generated from the electronic device attached thereon. The cooling liquid carrying the exchanged heat is returned to the rack liquid return line of rack manifold 1225 and back to heat exchangers 1211. In one embodiment, at least some of the cooling plates may be designed with the configuration, such as, for example, having a coaxial like fluid connector as described above. The cooling liquid distribution to the cooling plates can be implemented using the techniques described through this application.

In another embodiment, some of the server chassis 1203 may include an immersion tank containing immersion cooling liquid therein. The electronic devices of the corresponding server(s) are at least partially submerged into the immersion cooling liquid. The immersion cooling liquid may be dielectric cooling fluid, which may be circulated between the immersion tanks and heat exchanger 1211. The cooling liquid may be a single-phase cooling liquid or two-phase cooling liquid (also referred to as phase-change cooling liquid). The two-phase cooling liquid evaporates from a liquid form into a vapor form when the temperature of the cooling liquid is above a predetermined temperature threshold (e.g., the boiling point of the cooling liquid). The vapor flows upstream via the vapor line from the corresponding server chassis to heat exchanger 1211. Heat exchanger 1211 may include a condenser to condense the vapor from the vapor form back to the liquid form, where the cooling liquid is then supplied back to the server chassis.

Note that some of the server chassis 1203 may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. Rack manifold 1225 may include a first rack manifold for single-phase cooling and a second rack manifold for two-phase cooling to be coupled to the same or different server chassis for different types of cooling. Some of the sever chassis 1203 may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis 1203 may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack 1200 further includes optional RMU 1202 configured to provide and manage power supplied to servers 1203 and heat exchanger 1211. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to at least some of the remaining components of electronic rack 1200.

In one embodiment, RMU 1202 includes optional optimization module 1221 and rack management controller (RMC) 1222. RMC 1222 may include a monitor to monitor operating status of various components within electronic rack 1200, such as, for example, computing nodes 1203, heat exchanger 1211, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC 1222 configures the liquid pump and cooling fans of the fan modules based on the optimal pump speeds and fan speeds.

As previously explained, an embodiment of the disclosure may be (or include) a non-transitory machine-readable medium (such as microelectronic memory) having stored thereon instructions, which program one or more data processing components (generically referred to here as a "processor") to perform cooling operations. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A cooling assembly, comprising:
a cooling plate to be attached to an electronic device; and
a bidirectional connector for a circulating cooling fluid to the cooling plate, the bidirectional connector comprising:
   a first tubing structure having a first fluid channel therein to supply the cooling fluid flowing in a first direction to the cooling plate, and
   a second tubing structure that encloses the first tubing structure therein, wherein the first tubing structure is positioned spaced apart from the second tubing structure to form a second fluid channel between an outer surface of the first tubing structure and an inner surface of the second tubing structure, and wherein the second fluid channel is configured to receive the cooling fluid returned from the cooling plate, wherein the second fluid channel is spaced apart from the outer surface of the first tubing structure.

2. The cooling assembly of claim 1, further comprising a support structure positioned between the first tubing structure and the second tubing structure adapted to maintain a space between the first and second tubing structures and to allow the cooling fluid to flow in a second direction without substantially impeding the cooling fluid.

3. The cooling assembly of claim 1, further comprising a fluid line converter coupled to the bidirectional connector, the fluid line converter including:
a first breakout port in fluid communication with the first fluid channel, the first breakout port extending from the first fluid channel; and
a second breakout port in fluid communication with the second fluid channel.

4. The cooling assembly of claim 3, wherein the fluid line converter further comprises:
an inner tube having a first end connected to the first breakout port; and
an outer tube that encloses the inner tube, wherein the outer tube includes a first end connected to the second breakout port.

5. The cooling assembly of claim 4, wherein a second end of the inner tube and a second end of the outer tube form a coaxial port connected with the bidirectional connector, such that the first fluid channel is extended to the first breakout port and the second fluid channel is extended to the second breakout port.

6. The cooling assembly of claim 3, wherein the first breakout port is to be coupled to a supply manifold coupled to an external fluid source to receive the cooling fluid, and wherein the second breakout port is to be coupled to a return manifold and configured to return the cooling fluid back to the external fluid source via the return manifold.

7. The cooling assembly of claim 1, wherein a first end of the bidirectional connector comprises a head configured to block the first fluid channel and the second fluid channel while the bidirectional connector is not coupled to another bidirectional connector with the first end of the bidirectional connector.

8. The cooling assembly of claim 7, wherein the head is further configured to open the first fluid channel and the second fluid channel while the bidirectional connector is coupled to another bidirectional connector with the first end of the bidirectional connector.

9. The cooling assembly of claim 1, wherein a second end of the bidirectional connector comprises a barb positioned to couple the first fluid channel and the second fluid channel to separate hoses.

10. The cooling assembly of claim 3, wherein a dripless side of the bidirectional connector is connected to a dripless side of a second bidirectional connector of the cooling plate for cooling the electronic device.

11. The cooling assembly of claim 10, wherein one side of the second bidirectional connector with a barb structure is connected to the fluid line converter via a plurality of flexible hoses, the other side of the bidirectional connector being mounted onto the cooling plate.

12. A server chassis, comprising:
a plurality of electronic devices representing one or more servers; and
a plurality of cooling assemblies corresponding to the plurality of electronic devices, each of the plurality of cooling assemblies comprising:
   a cooling plate to be attached to one of the electronic devices; and
   a bidirectional connector for a circulating cooling fluid to the cooling plate, the bidirectional connector comprising:
      a first tubing structure having a first fluid channel therein to supply the cooling fluid flowing in a first direction to the cooling plate, and
      a second tubing structure that encloses the first tubing structure therein, wherein the first tubing structure is positioned spaced apart from the second tubing structure to form a second fluid channel between an outer surface of the first tubing structure and an inner surface of the second tubing structure, and wherein the second fluid channel is configured to receive the cooling fluid returned from the cooling plate, wherein the second fluid channel is spaced apart from the outer surface of the first tubing structure.

13. The server chassis of claim 12, wherein the cooling assembly further comprises a support structure positioned between the first tubing structure and the second tubing structure adapted to maintain a space between the first and second tubing structures and to allow the cooling fluid to flow in a second direction without substantially impeding the cooling fluid.

14. The server chassis of claim 12, wherein the cooling assembly further comprises a fluid line converter coupled to the bidirectional connector, the fluid line converter including:
a first breakout port in fluid communication with the first fluid channel, the first breakout port extending from the first fluid channel; and
a second breakout port in fluid communication with the second fluid channel.

15. The server chassis of claim 14, wherein the fluid line converter further comprises:
an inner tube having a first end connected to the first breakout port; and
an outer tube that encloses the inner tube, wherein the outer tube includes a first end connected to the second breakout port.

16. The server chassis of claim 15, wherein a second end of the inner tube and a second end of the outer tube form a coaxial port connected with the bidirectional connector, such that the first fluid channel is extended to the first breakout port and the second fluid channel is extended to the second breakout port.

17. The server chassis of claim 14, wherein the first breakout port is to be coupled to a supply manifold coupled to an external fluid source to receive the cooling fluid, and wherein the second breakout port is to be coupled to a return manifold and configured to return the cooling fluid back to the external fluid source via the return manifold.

18. An electronic rack, comprising:
- a rack manifold having a rack liquid supply line to receive first cooling liquid from a cooling liquid source and a rack liquid return line to return first warmer liquid back to the cooling liquid source; and
- a plurality of server chassis, each server chassis containing one or more servers, wherein each server chassis comprises:
  - a plurality of electronic devices representing the one or more servers, and
  - a plurality of cooling assemblies corresponding to the plurality of electronic devices, each cooling assembly comprising:
    - a cooling plate to be attached to one of the electronic devices; and
    - a bidirectional connector for a circulating cooling fluid to the cooling plate, the bidirectional connector comprising:
      - a first tubing structure having a first fluid channel therein to supply the cooling fluid flowing in a first direction to the cooling plate, and
      - a second tubing structure that encloses the first tubing structure therein, wherein the first tubing structure is positioned spaced apart from the second tubing structure to form a second fluid channel between an outer surface of the first tubing structure and an inner surface of the second tubing structure, and wherein the second fluid channel is configured to receive the cooling fluid returned from the cooling plate, wherein the second fluid channel is spaced apart from the outer surface of the first tubing structure.

19. The electronic rack of claim 18, wherein each cooling assembly further comprises a support structure positioned between the first tubing structure and the second tubing structure adapted to maintain a space between the first and second tubing structures and to allow the cooling fluid to flow in a second direction without substantially impeding the cooling fluid.

* * * * *